United States Patent [19]

Piano et al.

[11] Patent Number: 4,994,153

[45] Date of Patent: Feb. 19, 1991

[54] PROCESS FOR PREPARING NONCONDUCTIVE SUBSTRATES

[75] Inventors: Anthony M. Piano, New Haven, Conn.; Randolfo Galvez, North Bergen, N.J.

[73] Assignee: Olin Corporation, Cheshire, Conn.

[21] Appl. No.: 545,224

[22] Filed: Jun. 28, 1990

[51] Int. Cl.$^5$ .................... C25D 5/02; C25D 5/54
[52] U.S. Cl. .................... 204/15; 134/22.17; 134/22.19; 204/20; 204/26
[58] Field of Search .......... 204/15, 20, 26, 30; 134/22.17, 22.19

[56] References Cited

U.S. PATENT DOCUMENTS

| 409,096 | 8/1889 | Blank | 204/29 |
|---|---|---|---|
| 1,037,469 | 9/1912 | Goldberg | 427/123 |
| 1,352,331 | 9/1920 | Unno | 204/31 |
| 2,243,429 | 5/1941 | Lauz | 204/30 |
| 3,099,608 | 7/1963 | Radovsky et al. | 204/15 |
| 3,163,588 | 12/1964 | Shortt et al. | 204/16 |
| 4,035,265 | 7/1977 | Saunders | 252/510 |
| 4,090,984 | 5/1978 | Lin et al. | 252/511 |
| 4,239,794 | 12/1980 | Allard | 428/219 |
| 4,581,301 | 4/1986 | Michaelson | 428/551 |
| 4,619,741 | 10/1986 | Minten et al. | 204/15 |
| 4,622,107 | 11/1986 | Piano | 204/15 |
| 4,622,108 | 11/1986 | Polakovic et al. | 204/15 |
| 4,631,117 | 12/1986 | Minten et al. | 204/15 |
| 4,684,560 | 8/1987 | Minten et al. | 428/131 |
| 4,718,993 | 1/1988 | Cupta et al. | 204/15 |
| 4,724,005 | 2/1988 | Minten et al. | 106/307 |
| 4,874,477 | 10/1989 | Pendleton | 204/15 |
| 4,897,164 | 1/1990 | Piano et al. | 204/15 |

*Primary Examiner*—T. M. Tufariello
*Attorney, Agent, or Firm*—Donald M. Papuga

[57] ABSTRACT

Described herein is a process for treating the tooling holes or slots which have been coated with a carbon black dispersion in a nonconductive material which comprises removing said carbon black with an aqueous solution containing:
(a) an alkanolamine;
(b) an anionic surfactant which is the neutralized addition product of maleic and/or fumaric acid and a poly(oxylated) alcohol;
(c) a nonionic surfactant which is an aliphatic mono and/or diphosphate ester; and
(d) an alkali or alkaline earth metal hydroxide.

12 Claims, No Drawings

PROCESS FOR PREPARING NONCONDUCTIVE SUBSTRATES

BACKGROUND OF THE INVENTION

1. Field of the Invention

This invention relates to a process for preparing a nonconductive substrate for electroplating. Further, this invention relates to a process for treating the tooling holes of a printed wiring board.

2. Brief Description of Prior Art

For the past thirty years the printed wiring board industry has relied on the electroless copper deposition process to prepare through hole walls in printed wiring boards for electroplating. These plated through hole walls are necessary to achieve connections between two metal circuit patterns on each side of a printed wiring board or, in addition to this, between the inner layer circuit patterns of a multilayer board.

The electroless deposition of copper onto the through hole walls typically consists of precleaning a PWB and then processing according to the following sequence of steps:

Step 1. Preactivator
Step 2. Pd/Sn Activator
Step 3. Rinse
Step 4. Accelerator
Step 5. Rinse
Step 6. Electroless Copper Deposition
Step 7. Electroplating These processed boards may also be photoimaged before the electroplating process. Typically, the deposited copper layer on each through hole wall is about 1 ±0.2 mil thick.

Conventional electroless processes have several commercial disadvantages. They require a relatively long process time. The multiple treatment baths have complex chemistry which may require constant monitoring and individual ingredients which may require separate replenishment. The palladium/tin activator also may require expensive waste treatment. Furthermore, these electroless process baths may be very sensitive to contamination. Finally, the multiplicity of rinse baths may require large amounts of water.

Prior to the electroless method of plating through holes, graphite was employed to prepare the walls of the through holes for plating. For example, U.S. Pat. No. 3,099,608, which issued to Radovsky et al. on July 30, 1963, teaches a process for preparing the through hole walls of printed circuit boards for electroplating by initially depositing in said through holes a thin electrically nonconductive film of palladium metal in at least a semi-colloidal form. The patent discloses that graphite had been used previously as a conductive layer for electroplatinq thereon. See column 1, lines 63-70 and column 4, line 72 to column 5, line 11. These patentees noted several deficiencies with that graphite process including lack of control of the graphite application, poor deposit of the resultant electroplated metal, nonuniform through hole diameters, and low electrical resistance of the graphite.

U.S. Pat. No. 3,163,588, which issued to Shortt et al. on Dec. 29, 1964, also mentions that graphite or its equivalents may be employed to render through hole walls of electric circuit boards conductive for later electroplating metals thereon. See column 3, line 45 to column 4, line 2.

U.S. Pat. No. 4,581,301, which issued to Michaelson on Apr. 8, 1986, teaches the application of a seed layer of conductive particles, such as "carbon", on the walls of through holes before electrolytically plating copper over the seed layer. This reference does not explicitly teach the use of a continuous layer of carbon black dispersion in the seed layer, and does not recognize the advantage of using very small particles of carbon black such as presently claimed. See column 7, lines 63-66 which refer to particles passing through a 400 mesh screen. A 400 mesh screen is equivalent to about 35 microns.

Separately, graphite has been employed in numerous processes for preparing a nonconducting material for a metal coating or plating. For example, U.S. Pat. No. 409,096, which issued to Alois Blank on Aug. 13, 1889, teaches a process for applying copper to asbestos roofing material which comprises first applying powdered plumbago (graphite) in a volatile liquid such as varnish to the surface of the asbestos, then evaporating the volatile liquid to coat the asbestos fibers with fine particles of plumbago. The plumbago coated asbestos sheets are then immersed in a copper electroplating solution and electric current is applied to the coated asbestos sheet to form a thin film of copper thereon. The copper coated sheet is then immersed in a bath of molten metal such as tin, lead, or zinc, and is then removed from the molten bath to effect solidification of the molten metal. The resulting metal coated asbestos sheet is described as being relatively flexible, a nonconductor of heat and substantially fireproof.

U.S. Pat. No. 1,037,469, which issued to Goldberg on Sept. 3, 1912, and U.S. Pat. No. 1,352,331, which issued to Unno on Sept. 7, 1920, disclose processes for electroplating nonconducting materials by first coating the nonconducting material with wax, then coating the wax with a slurry of finely divided particles of graphite or other metal, followed by electroplating of the dust-coated surface with copper or other metal. Neither of these processes are particularly suitable for use in coating the hole walls of circuit boards because the holes are normally extremely narrow in diameter and immersing in wax would tend to plug the hole and prevent coating the hole walls with an electroplating material.

U.S. Pat. No. 2,243,429, which issued to Laux on May 27, 1941, discloses a process for electroplating a nonconductive surface by "graphiting" a thin layer onto the nonconducting surface followed by applying a copper layer electrolytically and "finally a further electrolytic deposit of another metal" is placed thereon.

Separately, carbon black formulations have been employed as conductive coatings for nonconductive materials. For example, U.S. Pat. No. 4,035,265, which issued to Saunders on July 12, 1977, discloses conductive paint compositions containing both graphite and carbon black along with air-hardenable binder. These paints are suitable for application to the walls of a building for use as a heating element.

U.S. Pat. No. 4,090,984, which issued to Lin et al. on May 23, 1978, teaches a semi-conductive coating for glass fibers comprising (a) a polyacrylate emulsion; (b) electrically conductive carbon black dispersion and (c) a thixotropic gelling agent. The conductive carbon black dispersions employed are those comprising electrically conductive carbon black dispersed in from about 3 to about 4% by weight of a suitable dispersing agent.

U.S. Pat. No. 4,239,794, which issued to Allard on Dec. 16, 1980, teaches dispersing a conductive carbon black in a latex binder with a selected dispersing agent, then impregnating this carbon black dispersion into a nonwoven fibrous web followed by drying any residual water, leaving a thin coating of carbon black dispersed on the surfaces of said fibers.

U.S. Pat. Nos. 4,619,741; 4,684,560 and 4,724,005, which issued to Karl L. Minten and Galina Pismennaya, on Oct. 28, 1986; Aug. 4, 1987; and Feb. 9, 1988, respectively, teach a process of electroplating the through holes of a PWB which is a significant improvement over the known electroless techniques. By this process, a liquid dispersion of carbon black particles is first applied to the nonconductive portions of the through holes; then the liquid dispersion medium is separated (i.e., evaporated) from the carbon black particles, thereby depositing a substantially continuous layer of carbon black particles on the nonconductive surfaces of the through holes; and next a substantially continuous metal layer is electroplated over the deposited carbon black layer. This process of Minten and Pismennaya has several advantages over the known electroless techniques including the elimination of the preactivator, the Pd/Sn activator and the accelerator; less possibility of pollution problems; better bath stability; and fewer possible side reactions. This disclosure of the above-mentioned U.S. Pat. Nos. of Minten and Pismennaya is incorporated herein by reference in their entirety.

Improvements and modifications of this Minten and Pismennaya process are shown in U.S. Pat. Nos. 4,622,107 (Piano); 4,622,108 (Polakovic and Piano); 4,631,117 (Minten, Battisti, and Pismennaya); and 4,718,993 (Cupta and Piano); 4,874,477 (Pendleton) and U.S. Pat. No. 4,897,164 (Piano and Galvez). The first of these patents teaches the use of a gas-forming compound (e.g. sodium carbonate) to remove loose or easily removable carbon black particles in the through holes. The second of these patents teaches the contacting of an alkaline hydroxide preconditioning solution to the through hole walls before application of the carbon black dispersion so that the carbon black dispersion will have better adhesion to the walls. The third listed patent teaches the use of this carbon black dispersion as a preactivator for electroless plating of the through holes. The fourth teaches the use of an alkaline silicate solution before the carbon black dispersion. The fifth patent teaches the use of an aqueous polyelectrolyte homopolymer conditioner solution before the carbon black dispersion bath. The sixth patent teaches the use of an alkaline borate solution to remove excess carbon black material on the rims and inner metal walls of the PWB through hole walls which might cause an undesirable, uneven plated surface to result. These six U.S. Patents are incorporated herein by reference in their entireties.

One problem when the substrate has been contacted with the carbon black dispersion described in the Minten and Pismennaya process, as well as the improvements thereto discussed above, is that the entire board gets coated including the holes which don't need to be coated, such as the tooling holes or slots.

BRIEF SUMMARY OF THE INVENTION

The present invention is directed to a process of removing carbon black that has been deposited on tooling holes or slots of a nonconductive substrate.

The carbon black is removed from the tooling holes or slots by contacting the substrate containing the tooling holes or slots with an aqueous solution comprising:
(a) an alkanolamine;
(b) an anionic surfactant which is the neutralized addition product of maleic and/or fumaric acid and a poly(oxylated) alcohol;
(c) a nonionic surfactant which is an aliphatic mono and/or diphosphate ester; and
(d) an alkali or alkaline earth metal hydroxide.

DESCRIPTION OF THE PREFERRED EMBODIMENTS

Printed wiring boards (also known as printed circuit boards) are generally laminated materials comprised of two or more plates or foils of copper, which are separated from each other by a layer of nonconducting material. Although copper is generally used as the electroplating metal in printed wiring boards, those skilled in the art will recognize that other metals such as nickel, gold, palladium, silver, and the like can also be electroplated by the process of this invention. The nonconducting layer or layers are preferably an organic material such as an epoxy resin impregnated with glass fiber particles. However, the nonconducting layer may also be comprised of thermosetting resins, thermoplastic resins, and mixtures thereof, with or without reinforcing materials such as fiberglass and fillers.

Suitable thermoplastic resins include the acetal resins; acrylics, such as methyl acrylate; cellulosic resins, such as ethyl cellulose, cellulose acetate, cellulose propionate, cellulose acetate butyrate, cellulose nitrate, and the like; chlorinated polyethers; nylon; polyethylene; polypropylene: polystyrene; styrene blends, such as acrylonitrile styrene copolymers and acrylo-nitrile-butadiene-styrene (ABS) copolymers; polycarbonates; polychlorotrifluoroethylene; and vinyl polymers and copolymers, such as vinyl acetate, vinyl alcohol, vinyl butyral, vinyl chloride, vinyl chlorideacetate copolymer, vinylidene chloride and vinyl formal; and the like.

Suitable thermosetting resins include alkyl phthalate; furane; melamine-formaldehyde; phenol formaldehyde and phenol-furfural copolymers; alone or compounded with butadiene acrylonitrile copolymer or acrylonitrile-butadiene-styrene (ABS) copolymers; polyacrylic esters; silicones; urea formaldehydes; epoxy resins; polyimides; alkyl resins; glyceryl phthalates; polyesters; and the like.

In many printed wiring board designs, the electrical pathway or pattern requires a connection between the separated copper plates at certain points in the pattern. This is usually accomplished by drilling holes at the desired locations through the laminate of copper plates and the nonconducting layer and then connecting the separate metal plates. The hole diameters of printed wiring boards generally range from between about 0.5 and about 10 millimeters in diameter, and preferably from about 1 to about 5 millimeters.

After drilling these through holes, it may be desirable to deburr the holes to make the hole walls relatively smooth. In the case of multilayer printed wiring boards, it may also be desirable to subject the boards to desmear or etchback operations to clean the inner copper interfacing surfaces of the through holes. Suitable preparative operations include any or all of the presently available conventional operations such as permanganate desmearing processes.

Once the surfaces of through holes have been made relatively smooth for plating, it is preferred to subject the PWB to a precleaning process in order to place the printed writing board in condition for receiving the liquid carbon black dispersion. In one preferred precleaning operation, the printed wiring board is first placed in a cleaner/conditioner bath for about 1 to 10 minutes at a temperature of bout 45° C. to about 70° C. to remove grease and other impurities from the hole wall surfaces. In this embodiment, one preferred cleaner is comprised of monoethanolamine, a nonionic surfactant and ethylene glycol in water; which is available as "BLACKHOLE Cleaner 2" from the Olin Hunt Specialty Products Inc. of West Paterson, NJ.

After the application of the cleaner, the PWB is subsequently rinsed in water to remove excess cleaner from the board and then contacted with a conditioner solution. The preferred method of contacting with a conditioner is dipping the cleaned PWB into a room temperature aqueous conditioner bath for about 1–10 minutes. This conditioner solution is used to ensure that substantially all of the hole wall glass/epoxy surfaces are properly prepared to accept a continuous layer of the subsequent carbon black particles. Such conditioner solutions have been customarily used in electroless processing to precondition the boards for the electroless chemistry. See U.S. Pat. No. 4,634,691, which issued to Lindsey on Jan. 6, 1987, for a discussion of conditioner solution. The Lindsey patent is incorporated herein by reference in its entirety. One preferred condition is "BLACKHOLE Conditioner" available from Olin Hunt Specialty Products Inc. of West Paterson, NJ. This conditioner formulation comprises the mixture of monoethanolamine and a polyamine resin in water and has a pH of about 10. The preferred concentration of total conditioner ingredients in water is from about 1% to about 10% by weight.

If the cleaner solution precedes the aqueous cleaner solution, it is preferred to rinse the treated board in a water rinse between the cleaner solution and the conditioner solution. It is also preferred to use a water rinse bath after the conditioner treatment.

The liquid carbon black dispersion is next applied to or contacted with the conditioned PWB. This dispersion contains three critical ingredients, namely, carbon black, one or more surfactants capable of dispersing the carbon black and a liquid dispersing medium such as water. The preferred method of applying the dispersion to the PWB include immersion, spraying or other methods of applying chemicals used in the PWB industry. A single working bath is sufficient for applying this carbon black dispersion; however, more than one bath may be used for rework or other purposes.

In preparing this liquid dispersion, the three critical ingredients and any other preferred ingredients are thoroughly mixed together to form a stable dispersion. This may be accomplished by subjecting a concentrated form of the dispersion to ball milling, colloidal milling, high-shear milling, ultrasonic techniques or other standard blending techniques. The thoroughly mixed dispersion is later diluted with more water while agitating to the desired concentration for the working bath. The preferred method of mixing is ball milling a concentrated form of the dispersion in a container having glass, mineral, or plastic beads therein for a period of about 1 to about 24 hours. This thorough mixing allows for the carbon black particles to be intimately coated or wetted with the surfactant. This mixed concentrate is then mixed with water or some other liquid dispersing medium to the desired concentration. The working bath is preferably kept agitated during both the diluting and applying steps to aid in keeping the dispersion stable.

As stated above, the carbon black particles should have an average particle diameter below about 3 microns while in the dispersion. It is desirable to have this average Particle diameter of carbon black as small as possible to obtain the desired plating characteristics of substantially even plating and no plating pullaways. It is preferred that the carbon black particles have an average particle diameter from about 0.1 to about 3.0 microns, more preferably from 0.2 to about 2.0 microns, when in said dispersion. The term "average particle diameter" as employed herein in both the specification and claims refers to average mean diameter of the particles (the average by number). The average mean diameter in the dispersion may be determined through the use of either a NiComp Model 270 submicron particle size analyzer (Version 3.0) or a HIAC PA-720 automatic particle size analyzer (both available from the HIAC/ROYCO Instrument Division of Pacific Scientific of Menlo Park, CA).

All types of carbon blacks may be used for this invention including the commonly available furnace blacks. However, it is preferred to utilize carbon blacks which are initially acidic or neutral, i.e., those which have a PH of between about 1 and about 7.5 and more preferably between about 2 and about 4 when slurried with water. Carbon black particles of the preferred type contain between about 1% and about 10% by weight of volatiles and have an amorphous structure.

These preferred carbon black particles are also very porous and generally their surface areas are from between about 45 to about 1100, and preferably between about 300 to about 600, square meters per gram as measured by the BET method (method of Brunauer-Emmett-Teller).

Illustrative carbon blacks suitable for use of this invention include Cabot XC-72R Conductive, Cabot Monarch 800, Cabot Monarch 1300, all manufactured by Cabot Corporation of Boston, MA. Other suitable carbon blacks include Columbian T-10189, Columbian Conductex 975 Conductive, Columbian CC-40-220, and Columbian Raven 3500, all available from Columbian Carbon Company of New York, NY. Monarch 800 and Raven 3500 are the two most preferred carbon blacks because of their ease of dispersion and low pH.

The term "liquid dispersing medium" as used herein in the present specification and claims includes water and polar organic solvents (both protic and aprotic). Suitable protic polar organic solvents may include lower alcohols ($C_1$-$C_4$) such as methanol, ethanol, isopropanol and isobutanol; polyhydric alcohols such as glycols (i.e. triethylene glycols); ether-alcohols such as cellosolve; organic acids, such as formic acid and acetic acid; acid derivatives such as trichloroacetic acid; and sulfonic acids such as methane sulfonic acid. Suitable aprotic polar organic solvents include aldehydes such as acetaldehyde; ketones such as acetone; aprotic aromatic solvents such as toluene and mineral spirits; aprotic halogenated hydro-carbons such as dichlorofluoromethane and dichlorodifluoromethane (FREON); dimethylformamide (DMF); N-methyl-pyrolidone; dimethylsulfoxide (DMSO); and esters of carboxylic acids such as methylformate, ethylacetate and cellosolve acetate. The preferred liquid dispersing medium is water because of cost and ease of use considerations. It is preferred to utilize deionized water which is free of lime, fluorine, iodine and other impurities normally found in tap water, in order to minimize interference of foreign ions during the subsequent electroplating step.

In addition to the water and carbon black, a third critical ingredient is needed in the dispersion, namely, a surfactant capable of dispersing said carbon black in said liquid dispersing medium (i.e., compatible with said carbon black and liquid dispersing medium). One or more of these is added to the dispersion in order to enhance the wetting ability and stability of the carbon black and permit maximum penetration by the carbon black within the pores and fibers of the nonconducting layer. Suitable wetting agents include anionic, nonionic and cationic surfactants (or combinations thereof such as amphoteric surfactants). The surfactants should be soluble, stable and preferably nonfoaming in the liquid carbon black dispersion. In general, for a polar continuous phase as in water, the surfactants should preferably have a high HLB number (8–18). The preferred type of surfactant will depend mainly on the pH of the dispersion. If the total dispersion is alkaline (i.e., has an overall pH in the basic range), it is preferred to employ an anionic or nonionic surfactant. Acceptable anionic surfactants include sodium or potassium salts of naphthalene sulfonic acid such as DARVAN No. 1 (R.T. Vanderbilt Co.), ECCOWET LF (Eastern Color and Chemical), PETRO AA, PETRO ULF (Petro Chemical Co., Inc.), and AEROSOL TO (American Cyanamid). Preferred anionic surfactants include neutralized phosphate ester-type surfactants such as MAPHOS 55, 56, 8135, 60A, L6 (Mazer Chemicals Inc.). The most preferable anionic surfactant for a liquid carbon black dispersion is MAPHOS 56. Suitable nonionic surfactants include ethoxylated nonyl phenols such as POLY-TERGENT® B-Series (Olin Corporation) or alkoxylated linear alcohols such as POLY-TERGENT SL-Series (Olin Corporation).

If the total dispersion is acidic, it is preferred to employ selected anionic surfactants or cationic surfactants. An acceptable group of anionic surfactants would be the sodium or potassium salts of naphthalene sulfonic acid described above. Acceptable cationic surfactants include cetyl dimethyl benzyl ammonium chloride such as AMMONYX T (Onyx Chemical Corporation); an ethanolated alkylguanidine amine complex such as AEROSOL C-61 (American Cyanamid); lipocals; dodecyldiphenyl oxide disulfonic acid (DDODA) such as DOWFAX 2A1 (Dow Chemical); a sodium salt of DDODA such as STRODEX (Dexter Chemical Corporation); and salts of complex organic phosphate esters. Preferred surfactants include amphoteric potassium salts of a complex amino acid based on fatty amines such as MAFO 13 and cationic ethoxylated soya amines such as MAZEEN S-5 or MAZTREAT (Mazer Chemicals Inc.). Combinations of surfactants may be employed. The term "surfactant", as used herein for making the carbon black dispersion, may include other forms of dispersing agents or aids such as low molecular weight polyelectrolytes and polymers.

The amount of carbon black in the dispersion should be less than about 4% by weight of the dispersion, preferably, less than about 2% by weight. It has been found that the use of higher concentrations of carbon blacks provide undesirable plating characteristics. In the same regard, the solids content (i.e., all of the ingredients other than the liquid dispersing medium) is preferably less than 10% by weight of the dispersion, more preferably, less than about 5.6% by weight.

The three above-noted critical components of the present invention, namely, the carbon black, liquid dispersing medium and surfactant, may be employed alone to form a liquid dispersion. In some situations, it may be desirable to add other preferred ingredients to this dispersion.

One additional preferred component of the liquid carbon black-containing dispersion is a strong basic material such as an alkaline hydroxide. Suitable strong basic materials include alkali metal hydroxides such as potassium hydroxide, sodium hydroxide, and lithium hydroxide. Ammonium hydroxide or alkaline earth metal hydroxides such as calcium hydroxide may also be employed, if desired. Potassium hydroxide is the most preferred strong basic material. The term "alkaline hydroxide" is used throughout the description and claims to identify these strong basic materials. Sufficient alkaline hydroxide may be added to the liquid carbon black dispersion in a proportion sufficient to increase the pH of the resulting carbon black-containing dispersion to between about 10 and about 14, and preferably between about 10 and about 12.

Following is a typical formulation of a suitable aqueous alkaline dispersion of carbon black showing the general range of proportions as well as the preferred range of proportions for the various components:

| Component | General Range | Preferred Range |
|---|---|---|
| Carbon Black | 0.1–4% by wt. | 0.15–2% by wt. |
| Surfactant | 0.01–4% | 0.05–2% |
| Alkaline Hydroxide | 0–1% | 0.4–0.8% |
| Water | Balance | Balance |

The liquid dispersion of carbon black is typically placed in a suitably agitated vessel and the printed wiring board to be treated is immersed in, sprayed with or otherwise contacted with the liquid dispersion. The temperature of the liquid dispersion in an immersion bath is maintained in the range of between about 15° C. and about 35° C. and preferably between about 20° C. and about 30° C., while the conditioned printed wiring board is immersed therein. The period of immersion generally ranges from about 1 to 10, and preferably from about 3 to 5 minutes. During immersion, the liquid carbon blackcontaining dispersion penetrates the holes of the printed wiring board and wets and contacts the glass fiber as well as the epoxy resin which forms the components of the insulating layer. The immersed board is then removed from the liquid carbon black-containing dispersion bath.

The carbon black-covered board is then subjected to a step where substantially all (i.e., more than about 95% by weight) of the water in the applied dispersion is removed and a dried deposit containing carbon black is left in the holes and on other exposed surfaces of the nonconducting layer. This may be accomplished by several methods such as by evaporation at room temperature, by a vacuum, or by heating the board for a short time at an elevated temperature, or by other equivalent means. Heating at an elevated temperature is the preferred method. Heating is generally carried out for between about 30 seconds and 45 minutes at a temperature of from about 75° C. to 120° C., more preferably from about 80° C. to 98° C. To insure complete coverage of the hole walls, the procedure of immersing the board in the liquid carbon black dispersion and then drying may be repeated one or more times.

This drying step yields a board which may be completely coated with the carbon black dispersion. This dispersion is not only coated on the drilled hole surfaces, which is desirable, but also entirely coats the copper plate or foil surfaces which is undesirable. Thus prior to many subsequent operations all carbon black must be removed from the copper plate or foil surfaces.

As an optional feature of the present invention, the dried deposit of carbon black in the through holes is then contacted with an aqueous alkaline solution containing an alkali metal borate. The preferred alkali metal borate is sodium borate. The preferred pH range of this alkaline solution is from about 9.5 to 11.0. The preferred bath temperature is from about 20° C. to 50° C. The functions of this step include removing excess carbon black material on the rims and inner metal walls of the PWB through holes and remove any loose carbon black particles from the through hole walls which might cause an undesirable uneven plated surface to result. The alkali metal borate also increases the surface porosity of the carbon black.

If used, the amount of alkali borate should be sufficient to remove substantially all of the loose or easily removable carbon black particles from the areas of the through holes. The preferred concentration may vary from about 2 to 50 grams per liter of water employed. This contacting step may be carried out by placing the PWB in an aqueous bath containing the alkali metal borate at a temperature from about 20° C. to 50° C. for about 20 seconds to 5 minutes.

The further removal of the carbon black, specifically from the outer copper surfaces including, especially, the rims of the drilled holes while leaving the coating intact on the glass fibers and epoxy surface of the hole walls, may be achieved by the employment of a microetch bath. Generally, this treatment is carried out at a temperature of about 20° C. to 30° C. for 35 seconds to about 3 minutes. One suitable sodium persulfate-based microetch is "BLACKHOLE MICROCLEAN I" available from Olin Hunt Specialty Products Inc. This product is preferably combined with sufficient sulfuric acid to make a microetch bath containing 100-300 grams of sodium persulfate per liter of deionized water and about 1 to 10% by weight sulfuric acid. The mechanism by which this microetch works is by not attacking the carbon black material deposited on the copper foil directly, but rather to attack exclusively the first few atomic layers of copper directly below which provides the adhesion for the coating. Hence, the fully coated board is immersed in the microetch solution to "flake" off the carbon black from the copper surfaces in the form of micro-flakelets. These micro-flakelets are removed from the microetch bath either by filtration through a pump or via a weir type filter arrangement commonly used in the PWB industry. The liquid carbon black dispersion, the alkali metal borate treatment, the microetch treatment, and the intermittent water rinses are preferably carried out by immersing the PWB in baths constructed of polypropylene or polyvinyl chloride (PVC) and kept agitated by a recirculation pump or pumped in air.

After the microetch step and a subsequent water rinse, the PWB may now either proceed to the photoimaging process and later be electroplated or be directly panel electroplated. It may be preferred to further clean the PWB with a citric acid anti-tarnish solution or any other acid cleaner solution or both after the above microetch step.

The thus treated printed wiring board is then ready for electroplating operation which includes immersing the PWB in a suitable electroplating bath for applying a copper coating on the hole walls of the nonconducting layer.

The present invention contemplates the use of any and all electroplating operations conventionally employed in applying a metal layer to the through hole walls of a PWB. Therefore, this claimed invention should not be limited to any particular electroplating bath parameters.

A typical copper electroplating bath is comprised of the following components in the following proportions:

| Component | General Proportions | Preferred Proportions |
| --- | --- | --- |
| Copper (as metal) | 2-3 oz/gal | 2.25-2.75 oz/gal |
| Copper Sulfate | 5-10 oz/gal | 6-9 oz/gal |
| 98% Concentrated $H_2SO_4$ (by weight) | 23-32 oz/gal | 27-30 oz/gal |
| Chloride Ion | 20-100 mg/l | 40-60 mg/l |

The electroplating bath is normally agitated and preferably maintained at a temperature of between about 20° C. and 25° C. The electroplating bath is provided with anodes, generally constructed of copper, and the printed wiring board to be plated is connected as a cathode to the electroplating circuit. For example, a current of about 30 amps per square foot is impressed across the electroplating circuit for a period of between about 40 and 60 minutes in order to effect copper plating on the hole walls of the nonconducting layer positioned between the two plates of copper up to a thickness of about 1 mil ±0.2 mil. This copper plating of the hole wall provides a current path between the copper layers of the printed wiring board. Other suitable electroplating conditions may be employed, if desired. Other electroplating bath compositions containing other copper salts or other metal salts such as salts of nickel, gold, palladium, silver and the like may be employed, if desired.

The printed wiring board is removed from the copper electroplating bath and then washed and dried to provide a board which is further processed. For example, the PWB may be subjected to a tin-lead electroplating operation.

After electroplating, the aqueous solution of this invention is used to treat the tooling holes or slots in the nonconductive substrate to remove carbon black. The aqueous solution of this invention comprises:

(a) an alkanolamine;
(b) an anionic surfactant which is the neutralized addition product of maleic and/or fumaric acid and a poly(oxylated) alcohol;
(c) a nonionic surfactant which is an aliphatic mono and/or diphosphate ester; and
(d) an alkali or alkaline earth metal hydroxide.

The alkanolamine which is used is preferably a lower alkanolamine, most preferably monoethanolamine. It is used in amounts of from about 5 to 15 g/liter, preferably from about 10 to 15 g/liter.

The anionic surfactant of component (b) is the addition product of maleic or fumaric acid and a poly(oxylated) alcohol. These surfactants are well known and their preparation is described in U.S. Pat. No. 4,533,485 issued Aug. 6, 1985, which is incorporated herein by reference. As described in said patent, the anionic surfactants are made by (1) reacting maleic or fumaric acids, or mixtures thereof with at least one selected poly(oxyalkylated) alcohol in the presence of a peroxy-type free radical initator to form a carboxylic acid group-containing addition product and (2) neutralizing said addition product with a sufficient amount of a neutralizing agent to convert at least a major portion of said carboxylic acid groups to salt groups. These surfactants are commercially available as the POLY-TERGENT series (Olin Corp.). This surfactant is used in amounts of from about 1 to about 15 g/liter, preferably from about 5 to about 8 g/liter.

The nonionic surfactant of component (c) is a commercially available aliphatic mono and/or diphosphate ester such as the MAPHOS surfactants (Mazer Chemicals Inc.). It is used in amounts of from about 5 to about 15 g/liter, preferably from about 10 to about 15 g/liter.

The alkali or alkaline earth metal hydroxide is preferably sodium hydroxide. It is used in amounts of from about 20 to about 60 g/liter, preferably from about 40 to about 50 g/liter.

EXAMPLES

The following examples are presented to define the invention more fully without any intention of being limited thereby. All parts and percentages are by weight unless otherwise explicitly specified.

PRINTED WIRING BOARD SPECIFICATIONS

Six multilayer laminated printed wiring boards were treated by the process of this invention. These multilayer printed wiring boards were comprised of four 35 micron thick copper plates secured by pressure fusing them with epoxy resin/glass fiber layers in an alternating fashion. These printed wiring boards were about 15.24 centimeters wide and about 22.86 centimeters in length. There were about 500 to about 1,000 holes, each about 1.0 millimeter in diameter drilled through the copper plates and epoxy resin/glass fiber layer.

EXAMPLE 1

These multilayer printed wiring boards described above were prepared for copper electroplating their through holes by first mechanically scrubbing the surfaces of the board. These multilayer printed wiring boards described above were prepared for copper electroplating by first contacting said printed wiring boards with a standard permanganate desmear solution (i.e., Permolin permanganate desmear system available from Olin Hunt Specialty Products Inc. of West Paterson, NJ). The boards were then immersed in the following sequence of aqueous baths (each about 132 liters volume) for the indicated times:

1. Cleaner (5 minutes)
2. Rinse with tap water (2 minutes)
3. Conditioner (4 minutes)
4. Rinse with tap water (2 minutes)
5. Carbon black preplating dispersion (4 minutes), (then dry at 93° C. for 20 minutes)
6. Sodium borate premicroetch conditioner (30 seconds)
7. Rinse with tap water (20 seconds)
8. Sodium Persulfate microetch (30 seconds)
9. Rinse with tap water (20 seconds)
10. Anti-tarnish solution (20 seconds)
11. Rinse with tap water (20 seconds)

Bath 1 was an aqueous solution containing a cleaner formulation comprised of monoethanolamine, a nonionic surfactant, and ethylene glycol in water to remove grease and other impurities from the surfaces of the boards. The bath was heated to about 60° C. to facilitate this cleaning. The cleaner formulation is available as "Blackhole Cleaner 2" from Olin Hunt Specialty Products Inc. of West Paterson, NJ.

Bath 3 was a room temperature aqueous alkaline bath which contains monoethanolamine and a polyelectrolyte copolymer and has a PH of about 10 to condition the hole wall surfaces of the board. The conditioner formulation is available as "Blackhole Conditioner" from Olin Hunt Specialty Products Inc. of West Paterson, NJ.

Bath 5 was a room temperature deionized water bath containing the carbon black preplating formulation. In this bath, the proportions of each ingredient were as follows:

0.094% by weight anionic surfactant (Maphos 56)
0.600% by weight KOH
0.310% by weight carbon black
1.004% by weight solids The balance of the bath was deionized water. This carbon black dispersion of bath 5 was prepared by milling a concentrated form of this dispersion in a pebble mill containing stone pebbles so that the concentration of pebbles occupied about one third of the mill volume. The surfactant was dissolved in deionized water/KOH to give continuous phase. Then the carbon black was added. Milling time was six hours. After milling, the concentrate was diluted with sufficient deionized water to make the dispersion in the above indicated proportions.

After bath 5, the boards were placed in a hot air recirculatory oven and heated to 93° C. for 20 minutes. This drying step removed the water from the carbon black coating on the board, thereby leaving a dried deposit of carbon black all over the board and in the through holes and tooling holes of the board. The drying also promotes adhesion between the carbon black and the nonconductive surfaces of the board.

Bath 6 was an aqueous bath heated to 43° C. and contained 10 grams of sodium tetraborate decahydrate and about 5.2 grams of liquid caustic soda per liter of deionized water to adjust the pH to 10.5. Its function was to facilitate the removal of dried carbon black material from the rim of the through holes as well as other copper surfaces of the boards in the following sodium persulfate/$H_2SO_4$ microetch step. This sodium borate premicroetch conditioner is available as "Blackhole Micro-Prep SR" from Olin Hunt Specialty Products Inc. of West Paterson, NJ.

Bath 8 was a room temperature aqueous bath and contained 200 grams of sodium persulfate per liter of deionized water and 0.5% by volume of the copper surfaces. It does not act on the resin/glass surfaces. This sodium persulfate microetch was made from "Blackhole Microclean I" and is available from Olin Hunt Specialty Products Inc. of West Paterson, NJ.

Bath 10 was a room temperature aqueous bath and contained 50 grams of citric acid per liter of deionized water and 0.5% by volume of concentrated $H_2SO_4$. Its function was to prevent the copper surfaces of the printed wiring boards from tarnishing.

Rinse baths 2, 4, 7, 9, and 11 were employed to prevent the carryover of chemicals from one treatment bath into the next.

After the treatment with this sequence of baths, the printed wiring boards were placed in an electroplating bath provided with an agitation means and heating means and which contained an electrolyte bath comprised of the following:

| PLATING BATH COMPOSITION | |
| --- | --- |
| Component | Proportions |
| Copper (as metal) | 2.5 oz./gal. |
| Copper sulfate | 6.2 oz./gal. |
| 98% Concentrated $H_2SO_4$ | 30 oz./gal. (by wt.) |
| Chloride ion | 40 mg/l |

The printed wiring boards were connected as cathodes in the electroplating vessel having a volume of about 720 liters. Twelve copper boards were immersed in the electrolyte and connected to the cell circuits as anodes. The copper boards had a length of about 91 cm; a width of about 9 cm; and a thickness of about 4 cm. Each face was about 819 square cm. A direct current of 30 amps per square foot was impressed across the electrodes in the electroplating bath for approximately 55 minutes. The bath was maintained at a temperature of about 25° C. during this period and agitation was effected by air sparging. At the end of this period, the printed wire board was disconnected from the electrolyte, washed with tap water, and dried.

After this electroplating step, the printed wiring boards were then subjected to the following sequence of aqueous baths:

1. Resist stripper (5 minutes)
2. Rinse with taP water (2 minutes)
3. Etchant (1 minute)
4. Rinse with tap water (30 seconds)

Bath 1 was an aqueous solution containing 5% by volume of a liquid caustic soda solution. Its purpose was to simulate the aqueous resist stripping operation that is normally carried out during manufacture of printed wiring boards. The bath was heated to about 49° C. to facilitate the removal.

Bath 3 was an aqueous solution containing an etching formulation comprised of a copper/ammonia complex and ammonium chloride and has a PH of about 8.5. This solution was operated at a temperature of 48° C. in a conveyorized mode using a spray pressure of about 15 to 18 psi. Its purpose was to etch all exposed copper metal from the surfaces of the printed wiring boards. This etchant was "High Speed Accu Guard" and is available from Olin Hunt Specialty Products Inc. of West Paterson, NJ.

A visual examination of these plated boards showed uniform copper plating everywhere except in the tooling holes. These tooling holes were tested with a dry film photoresist during the electroplating steps. Also, residual carbon black material was observed in every tooling hole. This observed carbon black material is undesirable because it may interfere with electrical performance of the plated PWB.

At this point, these PWB's were immersed in an aqueous solution containing a cleaning formulation comprised of about 10 grams of monoethanolamine, 5 grams of an anionic surfactant*, and 10 grams of anionic phosphate ester type surfactant (MAPHOS 56) per liter of deionized water, and about 40 grams per liter of sodium hydroxide. The bath was also equipped with an ultrasonic unit to facilitate the removal of the dried carbon black material in the tooling holes of the printed wiring boards. The bath was operated at a temperature of 60° C, and the printed wiring boards were immersed for a period of 10 minutes.

* [POLY-TERGENT CS-1, a sodium hydroxide neutralized addition product of fumaric acid and a poly(oxylated) alcohol which is a $C_{12}$-$C_{15}$ linear alcohol mixture--3-mole oxypropyl-12 mole oxyethyl-16 mole oxypropyl adduct.]

An examination of the tooling holes of the printed wiring boards was performed after this ultrasonic cleaning solution. All tooling holes were found to be completely void of carbon black material indicating that said cleaning solution, when used in conjunction with ultrasonic agitation, is sufficient for removal of residual dried carbon black material from these tooling holes.

What is claimed is:

1. A process for treating the tooling holes or slots formed in a nonconductive material which has been coated with a carbon black dispersion and electroplated, which comprises removing said carbon black with an aqueous solution containing:
   (a) an alkanolamine;
   (b) an anionic surfactant which is the neutralized addition product of malelic and/or fumaric acid and a poly(oxylated) alcohol;
   (c) a nonionic surfactant which is an aliphatic mono and/or diphosphate ester ; and
   (d) an alkali or alkaline earth metal hydroxide.

2. The process of claim 1, wherein said alkanolamine is a lower alkanolamine.

3. The process of claim 2, wherein said lower alkanolamine is monoethanolamine.

4. The process of claim 1, wherein said hydroxide is sodium hydroxide.

5. The process of claim 1, wherein said 15 alkanolamine is used in amounts of from about 5 to about grams/liter based on the total amount of aqueous solution.

6. The process of claim 1, wherein said anionic surfactant of (b) is used in amounts of from about 1 to about 15 grams/liter based on the total amount of aqueous solution.

7. The process of claim 1, wherein said nonionic surfactant of (c) is used in amounts of from about 5 to about 15 grams/liter based on the total amount of aqueous solution.

8. The process of claim 1, wherein said alkali or alkaline earth metal hydroxide is used in amounts of from about 20 to about 60 grams/liter based on the total amount of aqueous solution.

9. The process for electroplating the walls of through holes in a laminated printed wiring board comprised of at least one nonconducting layer laminated to and alternating with at least two separate conductive metal layers, which comprises the steps:
   (a) contacting said substrate having said through holes with a liquid dispersion of carbon black comprised of:
      (1) carbon black particles having an average particle size of less than about 3.0 microns in said dispersion;
      (2) an effective dispersing amount of a surfactant which is compatible with said carbon black; and
      (3) a liquid dispersing medium, wherein the amount of carbon black is sufficient to coat substantially all of said nonconducting surfaces of the hole walls and is less than about 4% by weight of said liquid dispersion;

(b) separating substantially all of the liquid dispersing medium from said applied dispersion, thereby depositing said carbon black particles in a substantially continuous layer on said nonconducting portions of said hole walls;

(c) microetching said metal layers of said printed wiring board to remove deposited carbon black therefrom; and (d) later electroplating a substantially continuous metal layer over the deposited carbon black layer on said nonconducting portions of hole walls, thereby electrically connecting said metal layers of said printed wiring board.

(e) then removing deposited carbon from the tooling holes or slots with an aqueous solution comprising:
  (1) an alkanolamine;
  (2) an anionic surfactant which is the neutralized addition product of maleic and/or fumaric acid and a poly(oxylated) alcohol;
  (3) a nonionic surfactant which is an aliphatic mono and/or diphosphate ester; and
  (4) an alkali or alkaline earth metal hydroxide.

10. The process of claim 9 wherein said alkanolamine is a lower alkanolamine.

11. The process of claim 9 wherein said hydroxide is sodium hydroxide.

12. An aqueous solution comprising:
  (a) an alkanolamine;
  (b) an anionic surfactant which is the neutralized addition product of maleic and/or fumaric acid and a poly(oxylated) alcohol;
  (c) a phosphate ester anionic surfactant; and
  (d) an alkali or alkaline earth metal hydroxide.

* * * * *

UNITED STATES PATENT AND TRADEMARK OFFICE
CERTIFICATE OF CORRECTION

PATENT NO. : 4,994,153
DATED : February 19, 1991
INVENTOR(S) : Anthony M. Piano and Randolfo Galvez It is certified that error appears in the above—identified patent and that said Letters Patent is hereby corrected as shown below:

In Column 7, line 29, correct the spelling of "TO" to --OT--.

In Column 14, line 36, after the word said delete "15".

Signed and Sealed this

Twenty-eighth Day of July, 1992

*Attest:*

DOUGLAS B. COMER

*Attesting Officer*  *Acting Commissioner of Patents and Trademarks*